United States Patent
Albertson et al.

(10) Patent No.: US 10,578,647 B2
(45) Date of Patent: Mar. 3, 2020

(54) PROBES FOR WAFER SORTING

(71) Applicant: Intel Corporation, Santa Clara, CA (US)

(72) Inventors: Todd Albertson, Warren, OR (US); Jin Yang, Hillsboro, OR (US); Donald E. Edenfeld, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 113 days.

(21) Appl. No.: 15/720,742

(22) Filed: Sep. 29, 2017

(65) Prior Publication Data

US 2019/0101569 A1    Apr. 4, 2019

(51) Int. Cl.
| | | |
|---|---|---|
| *B21J 5/08* | (2006.01) | |
| *G01R 1/067* | (2006.01) | |
| *G01R 31/26* | (2020.01) | |
| *G01R 3/00* | (2006.01) | |
| *B21G 3/12* | (2006.01) | |
| *B21J 5/02* | (2006.01) | |

(52) U.S. Cl.
CPC ............ *G01R 1/06733* (2013.01); *B21J 5/08* (2013.01); *G01R 1/06755* (2013.01); *G01R 3/00* (2013.01); *G01R 31/2601* (2013.01); *B21G 3/12* (2013.01); *B21J 5/027* (2013.01)

(58) Field of Classification Search
CPC ............ G01R 1/06733; G01R 1/06738; G01R 1/06755; B21J 5/08; B21J 9/06; B21J 9/08; B21J 5/027; B21K 1/46; B21G 3/12; B21G 3/16; B21G 3/28

See application file for complete search history.

(56) References Cited

U.S. PATENT DOCUMENTS

| | | | | | |
|---|---|---|---|---|---|
| 1,898,426 | A | * | 2/1933 | Dannell | B21J 5/08 |
| | | | | | 29/888.43 |
| 2,712,688 | A | * | 7/1955 | Steinmeyer | B21J 5/027 |
| | | | | | 29/889.7 |
| 3,399,290 | A | * | 8/1968 | Pardell | B21F 5/00 |
| | | | | | 219/150 R |

(Continued)

FOREIGN PATENT DOCUMENTS

WO    2010/017879 A  *  2/2010  ............... B21J 5/08

OTHER PUBLICATIONS

Translation; WO2010/017879 A, Feb. 2010.*

*Primary Examiner* — Edward T Tolan
(74) *Attorney, Agent, or Firm* — Schwabe, Williamson & Wyatt, P.C.

(57) ABSTRACT

Embodiments may include systems and methods for manufacturing a probe for wafer sorting or die testing. A probe for wafer sorting or die testing may include a probe body and a probe tip. The probe body may include a probe core and a probe plating layer around the probe core. The probe core may include a first material, and the probe plating layer may include a second material. The probe tip may be next to the probe core of the probe body and may include the first material. In addition, the probe tip may have an end surface that is smaller than a surface of the probe core, and larger than a single point. A probe-manufacturing device may include a forging unit, a clipping unit, and an actuation mechanism to control the forging unit and the clipping unit. Other embodiments may be described and/or claimed.

14 Claims, 8 Drawing Sheets

(56) References Cited

U.S. PATENT DOCUMENTS

| | | | | |
|---|---|---|---|---|
| 5,690,842 A | * | 11/1997 | Panchison | A61B 17/842 |
| | | | | 219/149 |
| 2005/0184028 A1 | * | 8/2005 | Baur | G01N 1/28 |
| | | | | 216/92 |
| 2008/0150557 A1 | * | 6/2008 | Baur | G01N 1/28 |
| | | | | 324/754.03 |
| 2008/0229893 A1 | * | 9/2008 | Shepard | B21D 37/01 |
| | | | | 83/697 |
| 2010/0104861 A1 | * | 4/2010 | Siddle | B22F 7/08 |
| | | | | 428/336 |
| 2013/0099813 A1 | * | 4/2013 | Hoshino | G01R 1/06722 |
| | | | | 324/755.01 |
| 2014/0184260 A1 | * | 7/2014 | Russell | G01R 1/06788 |
| | | | | 324/755.01 |
| 2015/0145546 A1 | * | 5/2015 | Tseng | G01R 1/06755 |
| | | | | 324/755.01 |
| 2016/0252547 A1 | * | 9/2016 | Soerensen | G01R 1/06755 |
| | | | | 324/755.03 |

\* cited by examiner

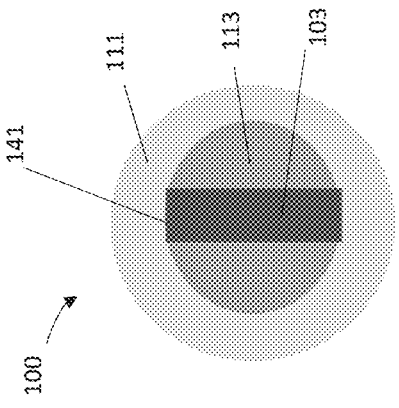
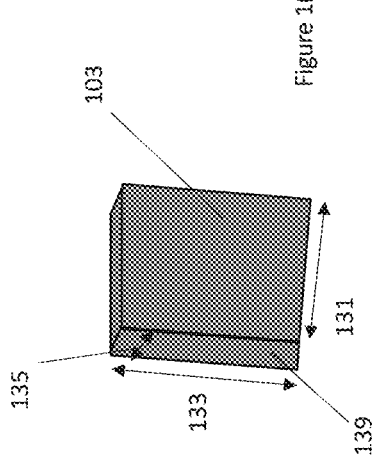
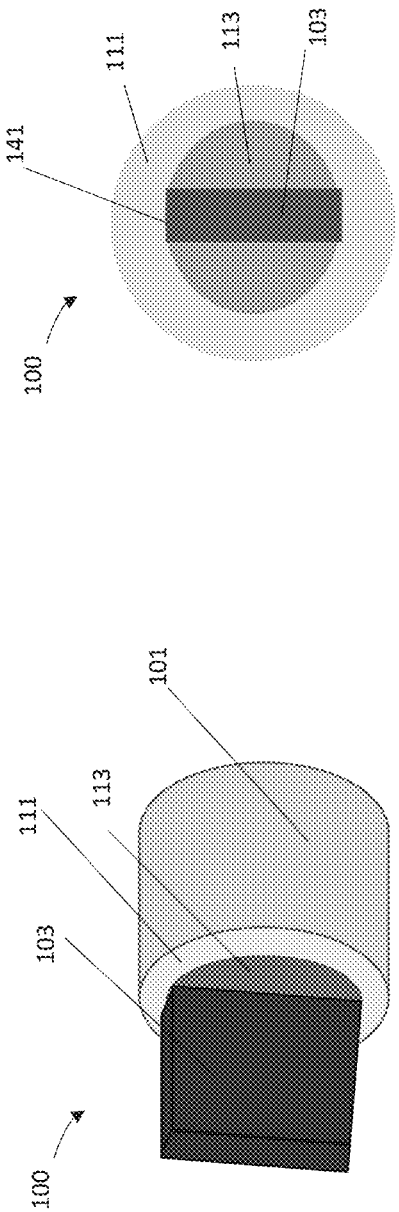

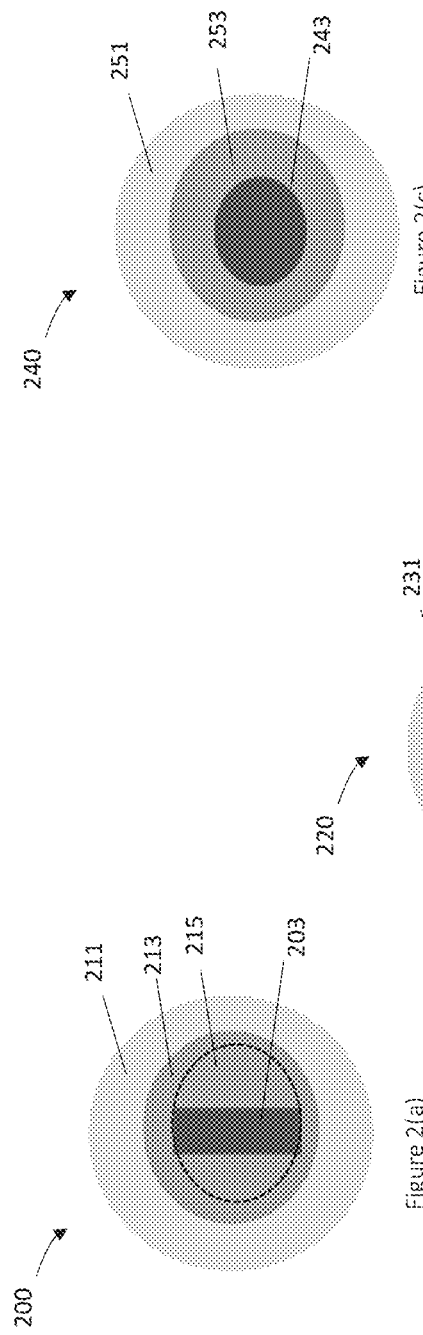

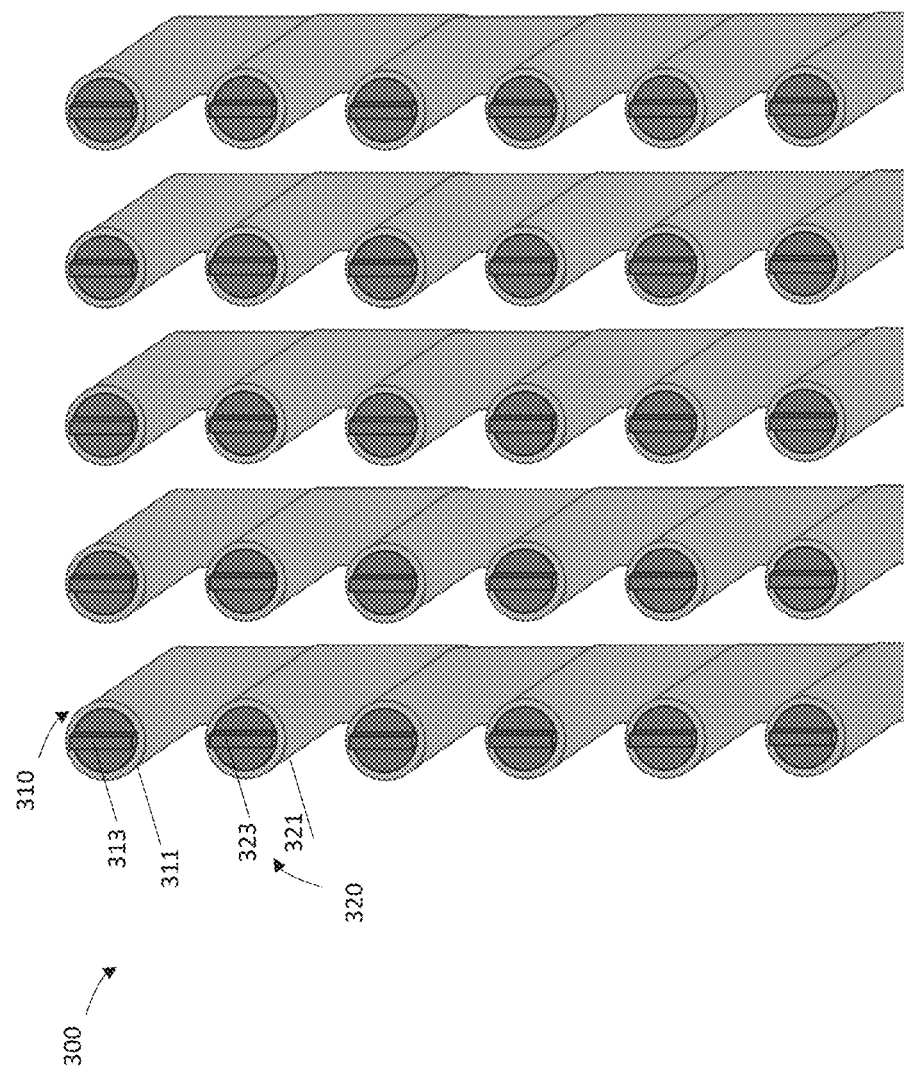

PROBES FOR WAFER SORTING

FIELD

Embodiments herein relate generally to the technical field of semiconductor manufacturing, and more particularly to structures, processes, and apparatus for manufacturing probes for wafer sorting or die testing.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Semiconductor devices are commonly found in modern electronic products to perform a wide range of functions such as high-speed calculations, transmitting and receiving electromagnetic signals, controlling electronic devices, transforming sunlight to electricity, or other functions. Semiconductor devices may generally be manufactured by forming multiple dies on a semiconductor wafer. Each die may be identical and contain circuits formed by electrically connecting various components. A wafer may be singulated to produce individual die that may be packaged to provide structural support and environmental isolation. Wafer sorting, wafer testing, or die testing, may be a testing process performed on wafers or dies to identify the non-functional or faulty wafers or dies.

Because the circuitry on a die or a wafer is small, visual detection of any defects on a wafer or a die may be virtually impossible. Hence, wafer sorting or die testing may be performed using specific testing equipment after the wafer or die has been manufactured. During a testing process, a probe may be positioned on contact pads, e.g., copper pillars, of the wafer or the die, to generate electrical contact. A probe geometry and profile may play an important role in contact between the probe and a contact pad of a wafer or a die. Conventional probe design may not provide stable electrical contact between the probe and a contact pad of a wafer or a die, leading to inaccurate testing results for the wafer or the die. The cost of testing equipments for wafer sorting or die testing may be very high due to miniaturization of probe geometry and increasing complexity of manufacturing process of probes for wafer sorting or die testing.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1(a)-1(c) illustrate an example probe for wafer sorting or die testing, where the probe may include a probe body and a probe tip, in accordance with various embodiments.

FIGS. 2(a)-2(c) illustrate example probes including various probe tip shapes or geometries, in accordance with various embodiments.

FIG. 3 illustrates an example probe array including multiple probes for wafer sorting or die testing, in accordance with various embodiments.

DETAILED DESCRIPTION

Figure 4:
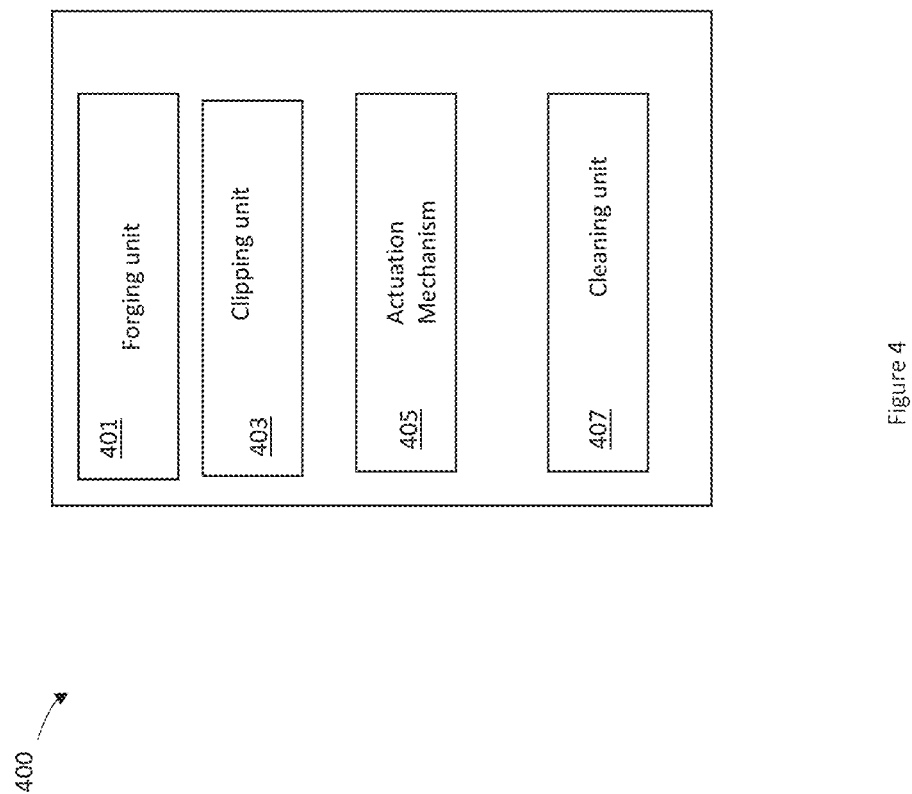
FIG. 4 illustrates an example probe-manufacturing device to be used to form a probe for wafer sorting or die testing, in accordance with various embodiments.

Studies show that a probe geometry and profile may play an important role in contact between the probe and a contact pad of a wafer or a die, and greatly impact a testing result of the wafer or the die. Sometimes, a probe may have a probe tip that is left to as-cut shape or planarized, which may not be able to generate enough physical contact with a contact pad, e.g., a copper pillar, on a wafer or a die being tested. In addition, contact pads of a wafer or a die may become smoother than the existing contact pads, which may further impact the contact behavior of a probe and the contact pads. Embodiments herein relate to a probe geometry and profile to better establish stable mechanical contact between a probe and a contact pad of a wafer or a die to have more reliable testing results for the wafer or the die being tested.

More specifically, embodiments herein relate to a probe with a probe body and a probe tip. The probe body may include a probe core and a probe plating layer around the probe core. The probe tip may be attached to the probe core of the probe body, and have a regular geometry. In addition, the probe tip may have an end surface that is smaller than a surface of the probe core, and larger than a single point or a single edge. In some embodiments, an end surface of the probe tip may be substantially flat and smaller than a surface of the probe core. Such a probe tip may help penetration of the probe through oxidation layer on the pad and into the contact pads on a wafer or a die being tested, creating higher friction under higher contact pressure between the probe tip and the contact pads.

In embodiments, a probe for wafer sorting or die testing may include a probe body and a probe tip attached to the probe body. The probe body may include a probe core and a probe plating layer around the probe core. The probe core may include a first material, and the probe plating layer may include a second material. The probe tip may be next to the probe core of the probe body. The probe tip may include the first material, which may be the same material for the probe core. In addition, the probe tip may have an end surface that is smaller than a surface of the probe core, and larger than a single point.

In embodiments, a probe-manufacturing device may include a forging unit, a clipping unit, and an actuation mechanism to control the forging unit and the clipping unit. The forging unit may forge a probe tip at a top part of a probe wire with the top part and a probe body. The probe wire may include a probe core and a probe plating layer around the probe core. The probe core may include a first material, and the probe plating layer may include a second material. The clipping unit may clip away undesired material from the probe tip.

In embodiments, a method for making a probe for wafer sorting or die testing may include providing a probe wire with a top part and a probe body. The probe wire may include a probe core and a probe plating layer around the probe core, the probe core may include a first material, and the probe plating layer includes a second material. The method may also include forging a probe tip at the top part of the probe wire, where the probe tip may include the first material. The probe tip may be next to the probe core of the probe body, and an end surface of the probe tip may be substantially flat and smaller than a surface of the probe core. The method may further include clipping away undesired material from the probe tip, and cleaning to remove materials accumulated during the forging the probe tip and the clipping away the undesired material.

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A or B" and "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The terms "coupled with" and "coupled to" and the like may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. By way of example and not limitation, "coupled" may mean two or more elements or devices are coupled by electrical connections on a printed circuit board such as a motherboard, for example. By way of example and not limitation, "coupled" may mean two or more elements/devices cooperate and/or interact through one or more network linkages such as wired and/or wireless networks. By way of example and not limitation, a computing apparatus may include two or more computing devices "coupled" on a motherboard or by one or more network linkages.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

FIGS. 1(a)-1(c) illustrates an example probe 100 for wafer sorting or die testing, where the probe 100 may include a probe body 101 and a probe tip 103, in accordance with various embodiments. For clarity, features of a probe for wafer sorting or die testing, e.g., the probe 100, may be described below as examples for understanding an example probe for wafer sorting or die testing. It is to be understood that there may be more or fewer components within a probe for wafer sorting or die testing. Further, it is to be understood that one or more of the components within the probe for wafer sorting or die testing may include additional and/or varying features from the description below, and may include any device that one having ordinary skill in the art would consider and/or refer to as a probe for wafer sorting or die testing. A probe for wafer sorting or die testing may be simply referred to as a probe herein, while wafer sorting or die testing may be simply referred to as wafer sorting.

FIG. 1(a) illustrates the probe 100 including the probe body 101 and the probe tip 103. The probe body 103 may include a probe core 113 and a probe plating layer 111 around the probe core 113. The probe tip 103 may be attached to the probe body 101, where the probe tip 103 may be next to the probe core 113 of the probe body 101.

The probe core 113 may include a first material, and the probe plating layer 111 may include a second material, which may be different from the first material. In addition, the probe tip 103 may include the first material, which may be the same material for the probe core 113. The first material included in the probe tip 103 and the probe core 113 may provide mechanical stiffness of the probe. For example, the first material may have a Young's modulus in a range of about 200 gigapascals (Gpa) to about 400 Gpa, or a hardness in Mohs scale in a range of about 7.5 to about 8. The first material included in the probe tip 103 and the probe core 113 may include tungsten (W), rhodium (Rh), rhenium (Re), tungsten-rhenium (WRe), tantalum (Ta), nickel (Ni), cobalt (Co), or nickel-cobalt (Ni—Co). The second material for the probe plating layer 111 may be soft materials to improve electrical and thermal performance of the probe 100 when used in wafer sorting. For example, the second material may include copper (Cu), silver (Ag), gold (Ag), or silver-gold (Ag—Au).

FIG. 1(b) illustrates the probe tip 103 in more details. The probe tip 103 may be of a rectangular shape, having a length 133 relative to a surface of the probe core 113 that is less than or equal to 50 micrometre (um), which may be similar to a diameter of the probe core 113. On the other hand, the probe tip 103 may have a width 135 relative to a surface of the probe core 113 that is less than or equal to 12 um, which is smaller than a diameter of the probe core 113. In addition, the probe tip 103 may have a height 131 relative to a surface of the probe core 113 that is less than or equal to 50 um, regardless of any shape the probe tip 103 may be. An end surface 139 of the probe tip 103 may be smaller than a surface of the probe core 113, and larger than a single point. The end surface 139 of the probe tip 103 may be substantially flat and is smaller than a surface of the probe core 113. For example, the end surface 139 may have a roughness parameter Ra ranging from a few microns down to sub-micron, e.g., 0.6-0.7 um. The probe tip 103 with such a profile and geometry may create more stable mechanical contact between the probe tip 103 and a contact pad, e.g., a copper pillar, on a wafer or a die being tested.

FIG. 1(c) illustrates a top down view of the probe 100. The probe 100 may include the probe core 113 and the probe plating layer 111 around the probe core 113. The probe tip 103 may be next to the probe core 113. In addition, the probe tip 103 may be in contact with an edge 141 of the probe core 113. For example, when the core 113 is of a circular shape and the probe tip 103 has a length, which is relative to a surface of the probe core 113, approximately equal to a diameter of the probe core 113, the probe 103 may be in contact with the edge 141 of the probe core 113.

FIGS. 2(a)-2(c) illustrate example probes, e.g., a probe 200, a probe 220, and a probe 240, including various tip shape and geometry, in accordance with various embodiments. In embodiments, the probe 200, the probe 220, or the probe 240 may be similar to the probe 100 shown in FIG. 1. The detailed description for each part of the probe 200, the probe 220, or the probe 240 may be similar to the description of a similar part for the probe 100.

FIG. 2(a) illustrates a top down view of the probe 200. The probe 200 may include a probe core 213 and a probe plating layer 211 around the probe core 213. A probe tip 203 may be next to the probe core 213 and may be of a rectangle shape. Different from the probe tip 103 shown in FIG. 1(c), the probe tip 203 may be next to an area 215 within the probe core 213 without intersection with an edge of the probe core 213.

FIG. 2(b) illustrates a top down view of the probe 220. The probe 220 may include a probe core 233 and a probe plating layer 231 around the probe core 233. A probe tip 223 may be next to the probe core 233 and may be of a polygon shape, different from the rectangular shape shown in FIG. 2(a).

FIG. 2(c) illustrates a top down view of the probe 240. The probe 240 may include a probe core 253 and a probe plating layer 251 around the probe core 253. A probe tip 243 may be next to the probe core 233 and may be of a circular shape, different from the rectangular shape shown in FIG. 2(a) or the polygon shape shown in FIG. 2(b).

The probe tip 203, the probe tip 223, and the probe tip 243 are shown as examples only and are not limiting. In addition to the circular shape, the rectangle shape, or the polygon shape shown in FIGS. 2(a)-2(c), a probe tip of a probe may be of any other shape or geometry, as long as the probe tip may help penetration of the probe tip into a contact pad on a wafer or a die being tested, to create high friction under high contact pressure between the probe tip and the contact pad. The size of a probe tip may be determined by the size of a contact pad of a wafer or a die being tested.

FIG. 3 illustrates an example probe array 300 including multiple probes, e.g., a probe 310, and a probe 320, for wafer sorting or die testing, in accordance with various embodiments. In embodiments, a probe of the probe array 300, e.g., the probe 310, or the probe 320, may be similar to the probe 100 shown in FIG. 1. The detailed description for each part of the probe 310, the probe 320, or any other probes in the probe array 300 may be similar to the description of a similar part for the probe 100. For example, the probe 310 may include a probe body 311 and a probe tip 313. Similarly, the probe 320 may include a probe body 321 and a probe tip 323. The probe body 311 and the probe body 321 may be similar to the probe body 101 shown in FIG. 1. Similarly, the probe tip 313 and the probe tip 323 may be similar to the probe tip 103 shown in FIG. 1.

In some embodiments, the probe tip 313 and the probe tip 323 may be of a same shape. In some other embodiments, the probe tip 313 and the probe tip 323 may be of different shapes. In embodiments, the probe array 300 may be built by making the individual probes, e.g., the probe 310 and the probe 320, and assembling the individual probes, e.g., the probe 310 and the probe 320 into a frame to form the probe array 300.

FIG. 4 illustrates an example probe-manufacturing device 400 to be used to form a probe for wafer sorting or die testing, in accordance with various embodiments. The probe-manufacturing device 400 may be used to form the probe 100, the probe 200, the probe 220, the probe 240, the probe 310, and the probe 320 shown in FIGS. 1(a)-1(c), FIGS. 2(a)-2(c), and FIG. 3.

In embodiments, the probe-manufacturing device 400 may include a forging unit 401, a clipping unit 403, a cleaning unit 407, and an actuation mechanism 405 to control the forging unit 401, the clipping unit 403, and the clean unit 407. All components, e.g., the forging unit 401, the clipping unit 403, the actuation mechanism 405, and the cleaning unit 407 may be fully integrated into a small-scale assembly to perform a process of forming a probe. It is to be understood that one or more of the components within the probe-manufacturing device 400 may include additional and/or varying features from the description below, and may include any device that one having ordinary skill in the art would consider and/or refer to as a probe-manufacturing device.

In embodiments, the forging unit 401 may be used to forge a probe tip at a top part of a probe wire. A probe wire may have the top part and a probe body, and a probe tip may be forged at the top part of the probe wire. The probe wire may include a probe core and a probe plating layer around the probe core. The probe core may include a first material that may be a hard material to provide mechanical stiffness of the probe, and the probe plating layer may include a second material that may be a soft material to improve electrical and thermal performance of the probe, as shown in FIGS. 1(a)-1(c), FIGS. 2(a)-2(c). The forging unit 401 may include a ceramic or metal material that may have a hardness higher than a hardness of the first material of the probe core.

In embodiments, the clipping unit 403 may be used to clip away undesired material from the probe tip. The undesired material may include the probe plating layer of the top part of the probe wire being deformed. The probe plating layer may include the second material that may be a soft material, e.g., Cu, Ag, Ag, or Ag—Au. During the process of forging the probe tip, the soft material of the probe plating layer may experience a dramatic plastic deformation at the top part of the probe wire, causing the probe plating layer extending out longer than the nominal size of the probe wire, forming the undesired material. The clipping unit 403 may cut away the undesired material. In some embodiments, the clipping unit 403 may move in a relative motion perpendicular to the probe tip formed by the forging unit 401. In embodiments, the clipping unit 403 may include a ceramic or metal material that has a hardness higher than a hardness of the first material of the probe core to maintain a long lifetime in usage.

In embodiments, the actuation mechanism 405 may control the forging unit 401 and the clipping unit 403, such as the direction and the size of the movements of the forging unit 401 and the clipping unit 403. Under the control of the actuation mechanism 405, the forging unit 401 and the clipping unit 403 may form a probe tip with a desired shape, and further clip away undesired material from the probe tip.

In embodiments, the cleaning unit 407 may remove materials accumulated during forging of the probe tip by the forging unit 401 and clipping away the undesired material by the clipping unit 403. In some embodiments, the cleaning unit 407 may include an air-cleaning feature to remove accumulated small silver, gold or tungsten particles.

Figure 5:
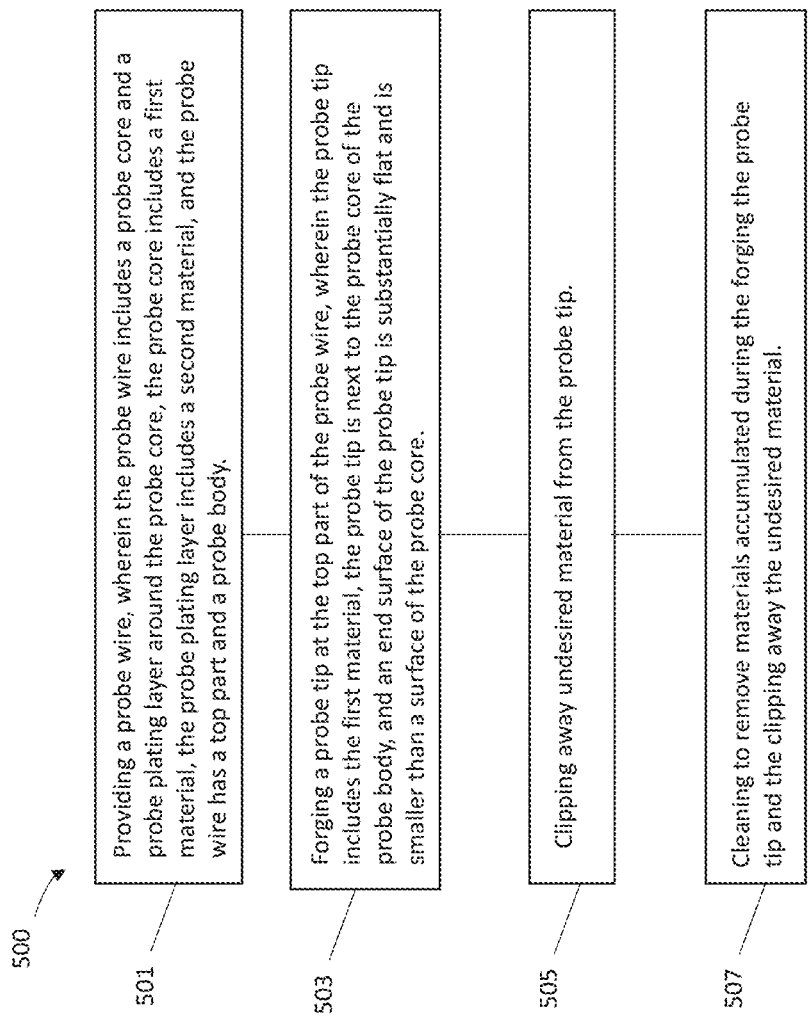
FIG. 5 illustrates an example process for a probe-manufacturing device to form a probe for wafer sorting or die testing, in accordance with various embodiments.

FIG. 5 illustrates an example process 500 for a probe-manufacturing device to form a probe for wafer sorting or die testing, in accordance with various embodiments. The process 500 may be performed by the probe-manufacturing device 400 to form the probe 100, the probe 200, the probe 220, the probe 240, the probe 310, and the probe 320 shown in FIGS. 1(a)-1(c), FIGS. 2(a)-2(c), and FIG. 3. The operations in the process 500 may be performed by the forging unit 401, the clipping unit 403, and the cleaning unit 407, controlled by the actuation mechanism 405.

Figure 6:
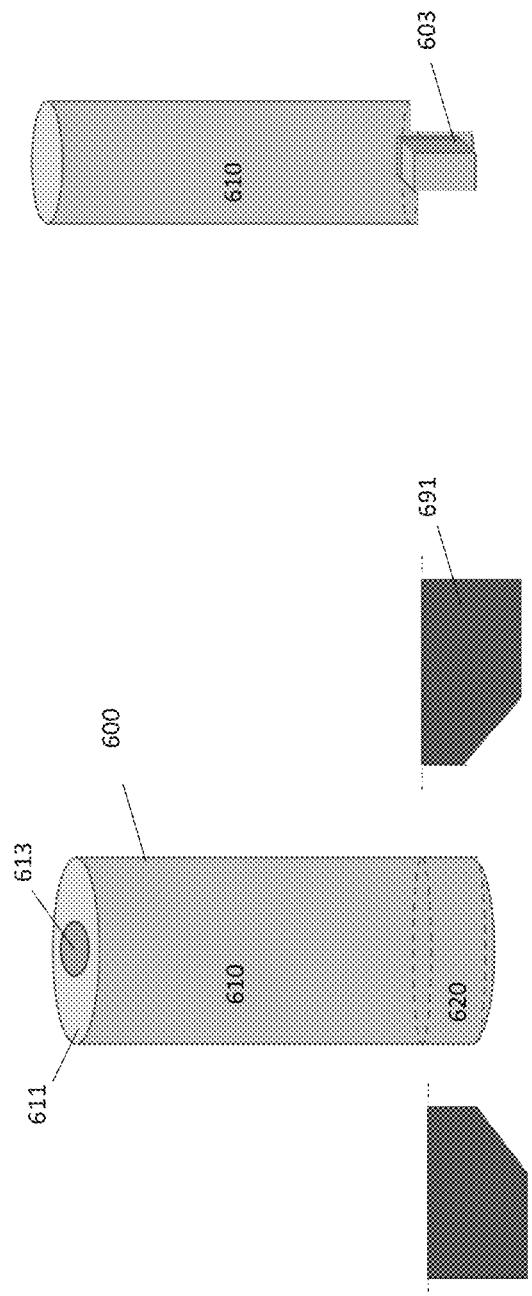
FIG. 6 illustrates an example process for forming a probe from a probe wire, in accordance with various embodiments.

In embodiments, operation 501 may be performed to provide a probe wire. The probe wire may have a top part and a probe body. The probe wire may include a probe core and a probe plating layer around the probe core. The probe core may include a first material, and the probe plating layer may include a second material. For example, as shown in FIG. 6, a probe wire 600 may be provided. The probe wire 600 may have a probe body 610 and a top part 620. The probe wire 600 may include a probe core 613 and a probe plating layer 611 around the probe core 613. The probe core 613 may include a first material, e.g., W, Rh, Re, WRe, Ta, Ni, Co, or Ni—Co. The first material may have a Young's modulus in a range of about 200 Gpa to about 400 Gpa, or a hardness in Mohs scale in a range of about 7.5 to about 8. The probe plating layer 611 may include a second material, e.g., Cu, Ag, Ag, or Ag—Au.

In embodiments, operation 503 may be performed to forge a probe tip at the top part of the probe wire. The probe tip may include the first material, and may be next to the probe core of the probe body. An end surface of the probe tip may be substantially flat and smaller than a surface of the probe core. For example, the operation 503 may be performed by the forging unit 401. As shown in FIG. 6, the top part 620 of the probe wire 600 may be forged by a forge unit 691 to form a probe tip 603, which may be of a rectangular shape. The forge unit 691 may be an example of the forge unit 401. The probe tip 603 may have a length, which is relative to a surface of the probe body 610, less than or equal to 50 um, a width, which is relative to a surface of the probe body 610, less than or equal to 12 um, and a height, which is relative to a surface of the probe body 610, less than or equal to 50 um. In some other embodiments, the probe tip 603 may be of a circular shape, a polygon shape, or other shape. The probe tip 603 may be next to the probe core 613 of the probe body 610. An end surface of the probe tip 603 may be substantially flat and smaller than a surface of the probe core 613.

In embodiments, operation 505 may be performed to clipping away undesired material from the probe tip. The undesired material may include the probe plating layer of the top part of the probe wire being deformed. For example, the operation 505 may be performed by the clipping unit 403. As shown in FIG. 6, the probe plating layer 611 of the top part 620 of the probe wire 600 may be deformed, and may extend out longer than the nominal size of the probe wire 600 to become undesired material. A clipping unit, e.g., the clipping unit 403 of FIG. 4, may cut away undesired material.

In embodiments, operation 507 may be performed to clean, e.g., to remove materials accumulated during the forging the probe tip and the clipping away the undesired material. For example, the operation 507 may be performed by the cleaning unit 407. In some embodiments, the cleaning unit 407 may include an air-cleaning feature to remove accumulated small silver, gold or tungsten particles.

In addition, the process 500 may include forming a probe array to include multiple probes, not shown. Each probe of the probe array may have a probe tip formed by forging the probe tip by operation 503, clipping away the undesired material from the probe tip by operation 505, and cleaning to remove the accumulated materials by operation 507, as shown in process 500.

Figure 7:
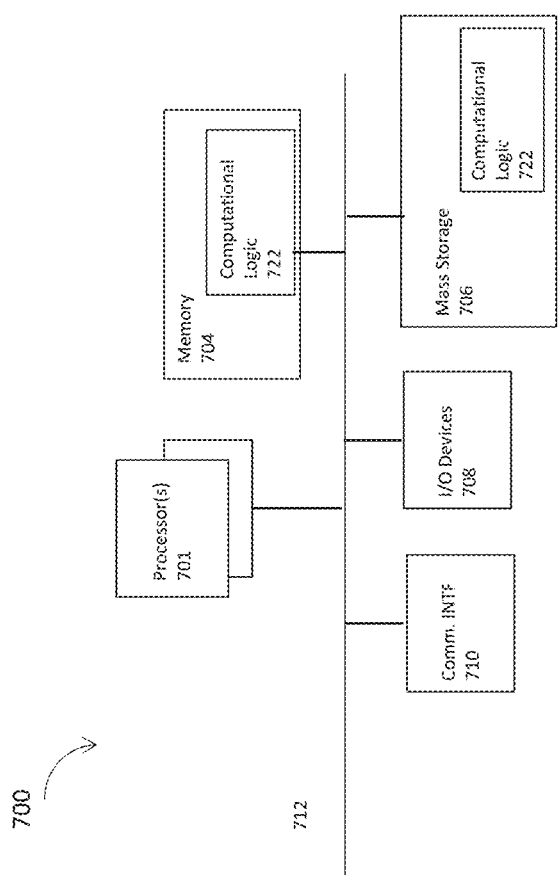
FIG. 7 illustrates an example device suitable for use to practice various aspects of the present disclosure, in accordance with various embodiments.

FIG. 7 illustrates an example computing device 700 that may include and/or be suitable for use with various components described herein. As shown, computing device 700 may include a processor 701, a system memory 704, and a mass storage 706. For the purpose of this application, including the claims, the terms "processor" and "processor cores" may be considered synonymous, unless the context clearly requires otherwise. In some embodiments, the processor 701, the system memory 704, and the mass storage 706 may be an example of the actuation mechanism 405 to control the forging unit 401, the clipping unit 403, and the cleaning unit 407, as shown in FIG. 4.

The processor 701 may include any type of processors, such as a central processing unit (CPU), a microprocessor, and the like. The processor 701 may be implemented as an integrated circuit having multi-cores, e.g., a multi-core microprocessor. The computing device 700 may include mass storage devices 706 (such as diskette, hard drive, volatile memory (e.g., dynamic random-access memory (DRAM), compact disc read-only memory (CD-ROM), digital versatile disk (DVD), and so forth). In general, system memory 704 and/or mass storage devices 706 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

The computing device 700 may further include I/O devices 708 (such as a display (e.g., a touchscreen display), keyboard, cursor control, remote control, gaming controller, image capture device, and so forth) and communication interfaces 710 (such as network interface cards, modems, infrared receivers, radio receivers (e.g., Bluetooth), and so forth). In some embodiments the I/O devices 708 may be coupled with the other components of the computing device 700, not shown.

The communication interfaces 710 may include communication chips (not shown) that may be configured to operate the device 700 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 710 may operate in accordance with other wireless protocols in other embodiments. In some embodiments, the communication interfaces 710 may be, may include, and/or may be coupled with the EC and/or TCPM as described herein.

The above-described computing device 700 elements may be coupled to each other via system bus 712, which may represent one or more buses. In the case of multiple buses, they may be bridged by one or more bus bridges (not shown). Each of these elements may perform its conventional functions known in the art. In particular, system memory 704 and mass storage devices 706 may be employed to store a working copy and a permanent copy of the programming instructions for the operation of various components of computing device 700, including but not limited to an operating system of computing device 700 and/or one or more applications. The various elements may be implemented by assembler instructions supported by the processor 701 or high-level languages that may be compiled into such instructions.

The permanent copy of the programming instructions may be placed into mass storage devices 706 in the factory, or in the field through, for example, a distribution medium (not shown), such as a compact disc (CD), or through communication interface 710 (from a distribution server (not shown)). That is, one or more distribution media having an implementation of the agent program may be employed to distribute the agent and to program various computing devices.

The number, capability, and/or capacity of the elements 708, 710, 712 may vary, depending on whether computing device 700 is used as a stationary computing device, such as a set-top box or desktop computer, or a mobile computing device, such as a tablet computing device, laptop computer, game console, or smartphone. Their constitutions are otherwise known, and accordingly will not be further described.

In embodiments, memory 704 may include computational logic 722 configured to implement various firmware and/or software services associated with operations of the computing device 700. For some embodiments, at least the processor 701 may be packaged together with computational logic 722 configured to practice aspects of embodiments described herein to form a system in package (SiP) or a SoC.

In various implementations, the computing device 700 may comprise one or more components of a data center, a laptop, a netbook, a notebook, an Ultrabook, a smartphone, a tablet, a personal digital assistant (PDA), an ultra mobile PC, a mobile phone, or a digital camera. In further implementations, the computing device 700 may be any other electronic device that processes data.

Figure 8:
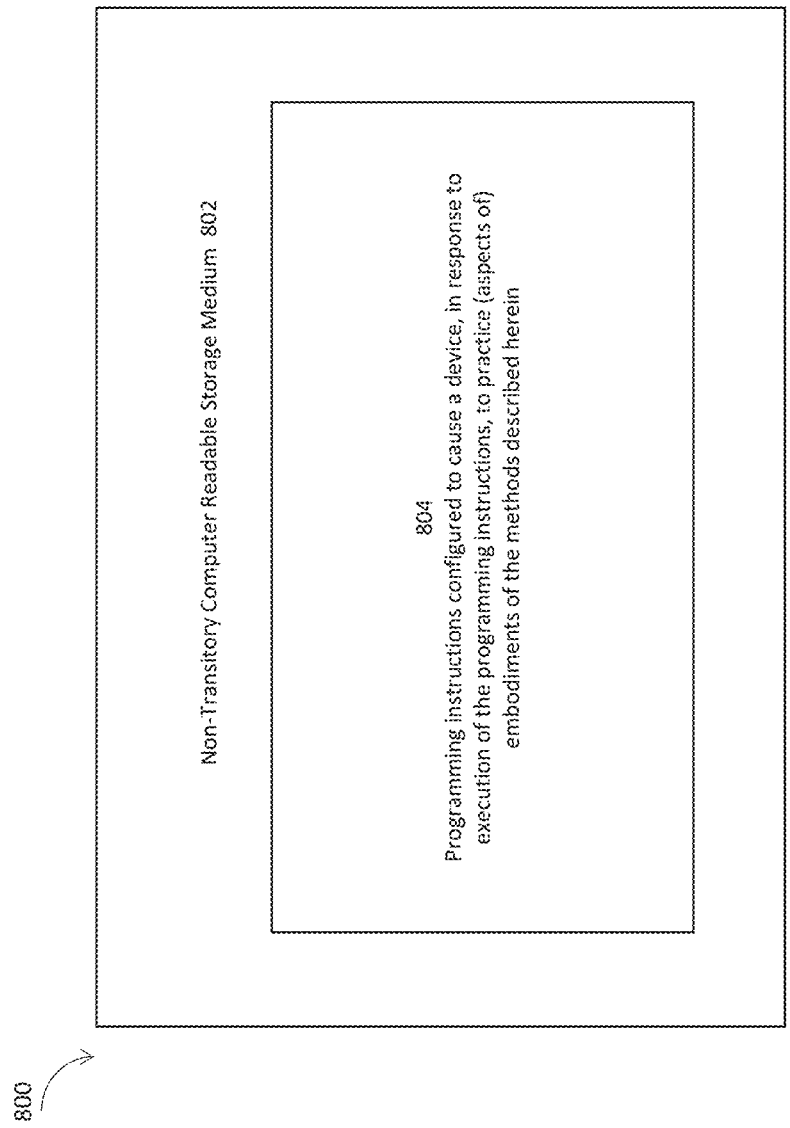
FIG. 8 illustrates a storage medium having instructions for practicing methods described with references to FIGS. 1(a)-7, in accordance with various embodiments.

Furthermore, the present disclosure may take the form of a computer program product embodied in any tangible or non-transitory medium of expression having computer-usable program code embodied in the medium. FIG. 8 illustrates an example computer-readable non-transitory storage medium that may be suitable for use to store instructions that cause an apparatus, in response to execution of the instructions by the apparatus, to practice selected aspects of the present disclosure. As shown, non-transitory computer-readable storage medium 802 may include a number of programming instructions 804. Programming instructions 804 may be configured to enable a device, e.g., device 700, in response to execution of the programming instructions, to perform, e.g., various operations associated with the actuation mechanism 405 to control the forging unit 401, the clipping unit 403, and the cleaning unit 407, as shown in FIG. 4.

In alternate embodiments, programming instructions 804 may be disposed on multiple computer-readable non-transitory storage media 802 instead. In alternate embodiments, programming instructions 804 may be disposed on computer-readable transitory storage media 802, such as, signals. Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments may be implemented as a computer process, a computing system or as an article of manufacture such as a computer program product of computer readable media. The computer program product may be a computer storage medium readable by a computer system and encoding a computer program instructions for executing a computer process.

The corresponding structures, material, acts, and equivalents of all means or steps plus function elements in the claims below are intended to include any structure, material or act for performing the function in combination with other claimed elements are specifically claimed. The description of the present disclosure has been presented for purposes of illustration and description, but is not intended to be exhaustive or limited to the disclosure in the form disclosed. Many modifications and variations will be apparent to those of ordinary skill without departing from the scope and spirit of the disclosure. The embodiment are chosen and described in order to best explain the principles of the disclosure and the practical application, and to enable others of ordinary skill in the art to understand the disclosure for embodiments with various modifications as are suited to the particular use contemplated.

Examples

Example 1 may include a probe for wafer sorting or die testing, comprising: a probe body, wherein the probe body includes a probe core and a probe plating layer around the probe core, wherein the probe core includes a first material and the probe plating layer includes a second material; and a probe tip attached to the probe body, wherein the probe tip is next to the probe core of the probe body, the probe tip includes the first material, and an end surface of the probe tip is smaller than a surface of the probe core, and larger than a single point.

Example 2 may include the probe of example 1 and/or some other examples herein, wherein the probe tip is of a circular shape, a rectangle shape, or a polygon shape.

Example 3 may include the probe of example 1 and/or some other examples herein, wherein the first material includes tungsten (W), rhodium (Rh), rhenium (Re), tungsten-rhenium (WRe), tantalum (Ta), nickel (Ni), cobalt (Co), or nickel-cobalt (Ni—Co).

Example 4 may include the probe of example 1 and/or some other examples herein, wherein the second material includes copper (Cu), silver (Ag), gold (Ag), or silver-gold (Ag—Au).

Example 5 may include the probe of any one of examples 1-4 and/or some other examples herein, wherein the probe tip is of a rectangular shape, a length of the probe tip relative to the surface of the probe core is less than or equal to 50 micrometer (um), and a width of the probe tip relative to the surface of the probe core is less than or equal to 12 um.

Example 6 may include the probe of any one of examples 1-4 and/or some other examples herein, wherein the probe tip has a height relative to the surface of the probe core that is less than or equal to 50 um.

Example 7 may include the probe of any one of examples 1-4 and/or some other examples herein, wherein the probe tip is in contact with an edge of the probe core.

Example 8 may include the probe of any one of examples 1-4 and/or some other examples herein, wherein the probe tip is next to an area within the probe core without intersection with an edge of the probe core.

Example 9 may include the probe of any one of examples 1-4 and/or some other examples herein, wherein the first material has a Young's modulus in a range of about 200 gigapascals (Gpa) to about 400 Gpa, and the first material has a hardness in Mohs scale in a range of about 7.5 to about 8.

Example 10 may include a method for making a probe for wafer sorting or die testing, comprising: providing a probe wire, wherein the probe wire includes a probe core and a probe plating layer around the probe core, the probe core includes a first material, the probe plating layer includes a second material, and the probe wire has a top part and a probe body; forging a probe tip at the top part of the probe wire, wherein the probe tip includes the first material, the probe tip is next to the probe core of the probe body, and an end surface of the probe tip is substantially flat and is smaller than a surface of the probe core; clipping away undesired material from the probe tip; and cleaning to remove materials accumulated during the forging the probe tip and the clipping away the undesired material.

Example 11 may include the method of example 10 and/or some other examples herein, further including: forming a probe array to include multiple probes, wherein a probe of the probe array has a probe tip formed by the forging the probe tip, the clipping away the undesired material from the probe tip, and the cleaning to remove the accumulated materials.

Example 12 may include the method of any one of examples 11-12 and/or some other examples herein, wherein the undesired material includes the probe plating layer of the top part of the probe wire being deformed.

Example 13 may include the method of any one of examples 11-12 and/or some other examples herein, wherein the probe tip is of a circular shape, a rectangle shape, or a polygon shape.

Example 14 may include the method of any one of examples 11-12 and/or some other examples herein, wherein the first material includes tungsten (W), rhodium (Rh), rhenium (Re), tungsten-rhenium (WRe), tantalum (Ta), nickel (Ni), cobalt (Co), or nickel-cobalt (Ni—Co).

Example 15 may include the method of any one of examples 11-12 and/or some other examples herein, wherein the second material includes copper (Cu), silver (Ag), gold (Ag), or silver-gold (Ag—Au).

Example 16 may include the method of any one of examples 11-12 and/or some other examples herein, wherein the probe tip is of a rectangular shape, a length of the probe tip relative to the surface of the probe core is less than or equal to 50 micrometer (um), and a width of the probe tip relative to the surface of the probe core is less than or equal to 12 um.

Example 17 may include the method of any one of examples 11-12 and/or some other examples herein, wherein the probe tip has a height relative to the surface of the probe core that is less than or equal to 50 um.

Example 18 may include the method of any one of examples 11-12 and/or some other examples herein, wherein the first material has a Young's modulus in a range of about 200 gigapascals (Gpa) to about 400 Gpa, and the first material has a hardness in Mohs scale in a range of about 7.5 to about 8.

Example 19 may include the method of any one of examples 11-12 and/or some other examples herein, wherein the probe tip is in contact with an edge of the probe core.

Example 20 may include a probe-manufacturing device, comprising: a forging unit to forge a probe tip at a top part of a probe wire, wherein the probe wire includes a probe core and a probe plating layer around the probe core, the probe core includes a first material, the probe plating layer includes a second material, and the probe wire has the top part and a probe body; a clipping unit to clip away undesired material from the probe tip; and an actuation mechanism to control the forging unit and the clipping unit.

Example 21 may include the probe-manufacturing device of example 20 and/or some other examples herein, further including: a cleaning unit to remove materials accumulated during forging of the probe tip by the forging unit and clipping away the undesired material by the clipping unit.

Example 22 may include the probe-manufacturing device of any one of examples 20-21 and/or some other examples herein, wherein the forging unit includes a ceramic or metal material that has a hardness higher than a hardness of the first material of the probe core.

Example 23 may include the probe-manufacturing device of any one of examples 20-21 and/or some other examples herein, wherein the clipping unit includes a ceramic or metal material that has a hardness higher than a hardness of the first material of the probe core.

Example 24 may include the probe-manufacturing device of any one of examples 20-21 and/or some other examples herein, wherein the first material includes tungsten (W), rhodium (Rh), rhenium (Re), tungsten-rhenium (WRe), tantalum (Ta), nickel (Ni), cobalt (Co), or nickel-cobalt (Ni—Co).

Example 25 may include the probe-manufacturing device of any one of examples 20-21 and/or some other examples herein, wherein the second material includes copper (Cu), silver (Ag), gold (Ag), or silver-gold (Ag—Au).

Example 26 may include one or more computer-readable media having instructions for a computer device to form an electronic apparatus, upon execution of the instructions by one or more processors, to perform the method of any one of examples 10-19.

Example 27 may include an apparatus for making a probe for wafer sorting or die testing, comprising: means for providing a probe wire, wherein the probe wire includes a probe core and a probe plating layer around the probe core, the probe core includes a first material, the probe plating layer includes a second material, and the probe wire has a top part and a probe body; means for forging a probe tip at the top part of the probe wire, wherein the probe tip includes the first material, the probe tip is next to the probe core of the probe body, and an end surface of the probe tip is substantially flat and is smaller than a surface of the probe core; means for clipping away undesired material from the probe tip; and means for cleaning to remove materials accumulated during the forging the probe tip and the clipping away the undesired material.

Example 28 may include the apparatus of example 27 and/or some other examples herein, further including: means for forming a probe array to include multiple probes, wherein a probe of the probe array has a probe tip formed by the forging the probe tip, the clipping away the undesired material from the probe tip, and the cleaning to remove the accumulated materials.

Example 29 may include the apparatus of any one of examples 27-28 and/or some other examples herein, wherein the undesired material includes the probe plating layer of the top part of the probe wire being deformed.

Example 30 may include the apparatus of any one of examples 27-28 and/or some other examples herein, wherein the probe tip is of a circular shape, a rectangle shape, or a polygon shape.

Example 31 may include the apparatus of any one of examples 27-28 and/or some other examples herein, wherein the first material includes tungsten (W), rhodium (Rh), rhenium (Re), tungsten-rhenium (WRe), tantalum (Ta), nickel (Ni), cobalt (Co), or nickel-cobalt (Ni—Co).

Example 32 may include the apparatus of any one of examples 27-28 and/or some other examples herein, wherein the second material includes copper (Cu), silver (Ag), gold (Ag), or silver-gold (Ag—Au).

Example 33 may include the apparatus of any one of examples 27-28 and/or some other examples herein, wherein the probe tip is of a rectangular shape, a length of the probe tip relative to the surface of the probe core is less than or equal to 50 micrometer (um), and a width of the probe tip relative to the surface of the probe core is less than or equal to 12 um.

Example 34 may include the apparatus of any one of examples 27-28 and/or some other examples herein, wherein the probe tip has a height relative to the surface of the probe core that is less than or equal to 50 um.

Example 35 may include the apparatus of any one of examples 27-28 and/or some other examples herein, wherein the first material has a Young's modulus in a range of about 200 gigapascals (Gpa) to about 400 Gpa, and the first material has a hardness in Mohs scale in a range of about 7.5 to about 8.

Example 36 may include the apparatus of any one of examples 27-28 and/or some other examples herein, wherein the probe tip is in contact with an edge of the probe core.

The foregoing description of one or more implementations provides illustration and description, but is not intended to be exhaustive or to limit the scope of embodiments to the precise form disclosed. Modifications and variations are possible in light of the above teachings or may be acquired from practice of various embodiments.

What is claimed is:

1. A method for making a probe for wafer sorting or die testing, comprising:
   providing a probe wire, wherein the probe wire includes a probe core and a probe plating layer around the probe core, the probe core includes a first material, the probe plating layer includes a second material, and the probe wire has a top part and a probe body, wherein the probe body and the top part comprise a substantially cylindrical shape;
   forging a probe tip at the top part of the probe wire, wherein the probe tip includes the first material, including forming the probe tip to extend from the probe core of the probe body, and shaping an end surface of the probe tip to be substantially flat and smaller than a surface of the probe core, wherein forming the probe tip includes forging the probe tip into a rectangular shape, with a length of the probe tip relative to the surface of the probe core being less than or equal to 50 micrometer (um), a height relative to the surface of the probe core being is less than or equal to 50 um, and a width of the probe tip relative to the surface of the probe core being less than or equal to 12 um;
   clipping away undesired material from the probe tip; and
   cleaning to remove materials accumulated during the forging the probe tip and the clipping away the undesired material.

2. The method of claim 1, further including:
   forming a probe array to include multiple probes, wherein a probe of the probe array has a probe tip formed by the forging the probe tip, the clipping away the undesired material from the probe tip, and the cleaning to remove the accumulated materials.

3. The method of claim 1, wherein the undesired material includes the probe plating layer of the top part of the probe wire being deformed.

4. The method of claim 1, wherein the probe tip is of a circular shape, a rectangle shape, or a polygon shape.

5. The method of claim 1, wherein the first material includes tungsten (W), rhodium (Rh), rhenium (Re), tungsten-rhenium (WRe), tantalum (Ta), nickel (Ni), cobalt (Co), or nickel-cobalt (Ni—Co).

6. The method of claim 1, wherein the second material includes copper (Cu), silver (Ag), gold (Ag), or silver-gold (Ag—Au).

7. The method of claim 1, wherein the first material has a Young's modulus in a range of about 200 gigapascals (Gpa) to about 400 Gpa, and the first material has a hardness in Mohs scale in a range of about 7.5 to about 8.

8. The method of claim 1, wherein the probe tip is in contact with an edge of the probe core.

9. A probe-manufacturing device, comprising:
   a forging unit to forge a probe tip at a top part of a probe wire, wherein the probe wire includes a probe core and a probe plating layer around the probe core, the probe core includes a first material, the probe plating layer includes a second material, and the probe wire has the top part and a probe body, wherein the probe body and the top part comprise a substantially cylindrical shape, wherein the forging unit is adapted to forge the probe tip into a rectangular shape, with a length of the probe tip relative to the surface of the probe core being less than or equal to 50 micrometer (um), a height relative to the surface of the probe core being is less than or equal to 50 um, and a width of the probe tip relative to the surface of the probe core being less than or equal to 12 um;
   a clipping unit to clip away undesired material from the probe tip; and
   an actuation mechanism to control the forging unit and the clipping unit.

10. The probe-manufacturing device of claim 9, further including:
    a cleaning unit to remove materials accumulated during forging of the probe tip by the forging unit and clipping away the undesired material by the clipping unit.

11. The probe-manufacturing device of claim 9, wherein the forging unit includes a ceramic or metal material that has a hardness higher than a hardness of the first material of the probe core.

12. The probe-manufacturing device of claim 9, wherein the clipping unit includes a ceramic or metal material that has a hardness higher than a hardness of the first material of the probe core.

13. The probe-manufacturing device of claim 9, wherein the first material includes tungsten (W), rhodium (Rh), rhenium (Re), tungsten-rhenium (WRe), tantalum (Ta), nickel (Ni), cobalt (Co), or nickel-cobalt (Ni—Co).

14. The probe-manufacturing device of claim 9, wherein the second material includes copper (Cu), silver (Ag), gold (Ag), or silver-gold (Ag—Au).

* * * * *

UNITED STATES PATENT AND TRADEMARK OFFICE
CERTIFICATE OF CORRECTION

PATENT NO. : 10,578,647 B2
APPLICATION NO. : 15/720742
DATED : March 3, 2020
INVENTOR(S) : Todd Albertson, Jin Yang and Donald E. Edenfeld It is certified that error appears in the above-identified patent and that said Letters Patent is hereby corrected as shown below:

In the Claims

Column 15
Line 53, "… being is" should read -- … being --

Column 16
Line 34, "… being is" should read -- … being --

Signed and Sealed this
Twenty-first Day of February, 2023

Katherine Kelly Vidal
*Director of the United States Patent and Trademark Office*